(12) United States Patent
Chang et al.

(10) Patent No.: US 10,396,196 B1
(45) Date of Patent: Aug. 27, 2019

(54) SEMICONDUCTOR DEVICES

(71) Applicant: Vanguard International Semiconductor Corporation, Hsinchu (TW)

(72) Inventors: Jui-Chun Chang, Hsinchu (TW); Shih-Kai Wu, Hsinchu (TW); Cheng-Yu Wang, Chiayi (TW); Li-Yang Hong, Taoyuan (TW); Chia-Ming Hsu, Taichung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/262,256

(22) Filed: Jan. 30, 2019

(51) Int. Cl.
*H01L 29/76* (2006.01)
*H01L 29/78* (2006.01)
*H01L 29/06* (2006.01)
*H01L 21/762* (2006.01)
*H01L 29/66* (2006.01)

(52) U.S. Cl.
CPC .... *H01L 29/7824* (2013.01); *H01L 21/76264* (2013.01); *H01L 29/0653* (2013.01); *H01L 29/0696* (2013.01); *H01L 29/66681* (2013.01)

(58) Field of Classification Search
CPC .................................................. H01L 21/76264
See application file for complete search history.

(56) References Cited

U.S. PATENT DOCUMENTS

2012/0049271 A1  3/2012  Yamada et al.
2013/0328123 A1* 12/2013  Chen ................. H01L 29/41766
                                                           257/335

OTHER PUBLICATIONS

An Office Action issued in corresponding Taiwanese Application No. 107137752 dated Apr. 24, 2019.

* cited by examiner

*Primary Examiner* — Samuel A Gebremariam
(74) *Attorney, Agent, or Firm* — Birch, Stewart, Kolasch & Birch, LLP (57) ABSTRACT

A semiconductor device includes a substrate, a semiconductor layer, a doped region, a device region, a first isolation structure, a second isolation structure and a terminal. The semiconductor layer is disposed over the substrate. The doped region is disposed in the semiconductor layer. The device region is disposed on the doped region and includes a source, a drain and a gate. The first isolation structure is disposed in the semiconductor layer and surrounds the doped region. The second isolation structure surrounds the first isolation structure and is spaced apart from the first isolation structure. The terminal is disposed between the first isolation structure and the second isolation structure, and is equipotential with the source.

10 Claims, 12 Drawing Sheets

SEMICONDUCTOR DEVICES

BACKGROUND

Technical Field

The embodiment of the present disclosure relates to semiconductor manufacturing, and in particular it relates to semiconductor-on-insulator (SOI) semiconductor devices.

Description of the Related Art

Semiconductor devices include a substrate and a circuit component disposed over the substrate, and have been widely used in various electronic applications, such as personal computers, mobile phones, digital cameras, and other electronic equipment. The evolution of semiconductor devices continuously influences and improves the way people live.

Semiconductor devices typically include an isolation structure to electrically isolate devices formed on a semiconductor substrate. The isolation structure is provided by etching a trench in the semiconductor device and then forming an insulating material in the trench. There are two types of isolation structures: shallow trench isolation (STI) structures and deep trench isolation (DTI) structures, depending on the depth of the trench. The shallow trench isolation structures are often used to reduce parasitic capacitance and provide a lower level of voltage isolation between devices. On the other hand, the deep trench isolation structures have deeper depths to provide isolation between the different types of integrated circuits which share the same semiconductor substrate.

However, although these isolation structures generally meet requirements, they are still not satisfactory in every respect, and may limit the performance of the semiconductor devices under some conditions. Therefore, it is necessary to further improve semiconductor devices and isolation structures to give semiconductor devices a wider range of applications.

BRIEF SUMMARY

In accordance with some embodiments of the present disclosure, a semiconductor device is provided. The semiconductor device includes a semiconductor layer disposed over a substrate; a doped region disposed in the semiconductor layer; a device region disposed on the doped region, and including a source, a drain and a gate; a first isolation structure disposed in the semiconductor layer and surrounding the doped region; a second isolation structure surrounding the first isolation structure and spaced apart from the first isolation structure; and a terminal disposed between the first isolation structure and the second isolation structure, and being equipotential with the source.

In some embodiments, the first isolation structure and the second isolation structure are spaced apart by a portion of the semiconductor layer.

In some embodiments, the doped region includes a first conductivity type doped region adjacent to the terminal and a second conductivity type doped region away from the terminal, wherein the first conductivity type doped region and the second conductivity type doped region have different conductivity types.

In some embodiments, the source is disposed over the first conductivity type doped region and the drain is disposed over the second conductivity type doped region.

In some embodiments, the semiconductor device further includes a plurality of first device regions disposed on a plurality of first doped regions; and a plurality of first isolation structures disposed in the semiconductor layer, wherein each of the plurality of first isolation structures respectively surrounds each of the plurality of first doped regions.

In some embodiments, the second isolation structure surrounds the plurality of first isolation structures and is spaced apart from each of the plurality of first isolation structures.

In some embodiments, the semiconductor device further includes an additional second isolation structure in juxtaposition with the second isolation structure.

In some embodiments, the semiconductor device further includes a plurality of second device regions disposed on a plurality of second doped region and surrounded by the additional second isolation structure, wherein the plurality of second device regions and the plurality of first device regions have different conductivity types.

In some embodiments, the semiconductor device further includes a plurality of terminals respectively disposed in the additional second isolation structure and the second isolation structure.

In some embodiments, the semiconductor device further includes an insulating layer disposed between the substrate and the semiconductor layer, and bottoms of the first isolation structure and the second isolation structure are in contact with the insulating layer.

BRIEF DESCRIPTION OF THE DRAWINGS

The disclosure can be more fully understood from the following detailed description when read with the accompanying figures. It is worth noting that, in accordance with standard practice in the industry, various features are not drawn to scale and are for illustrative purposes only. In fact, the dimensions of the various features may be arbitrarily increased or reduced for clarity of the features of the present disclosure.

DETAILED DESCRIPTION

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the sequences of processes and/or including more or fewer steps than described herein. Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations.

A semiconductor device and a method for forming the same are described in accordance with some embodiments of the present disclosure, and are particularly applicable to a semiconductor device having an application for applying a back bias voltage to a substrate. The present disclosure provides two isolation structures disposed on a semiconductor device, and a terminal equipotential to the source disposed between the two isolation structures to eliminate interference on the internal components caused by voltage applied to the outside of the isolation structure, thereby improving reliability and safe operation interval.

For convenience of description, the present disclosure is described below as a laterally diffused metal oxide semiconductor (LDMOS) device having a semiconductor-on-insulator (SOI) substrate, but the present disclosure is not limited thereto. The present disclosure is also applicable to other types of metal oxide semiconductor devices, such as a vertically diffused metal oxide semiconductor (VDMOS) device, an extended-drain metal oxide semiconductor (ED-MOS) device or the like. In addition, the present disclosure is also applicable to other types of semiconductor devices, such as a diode, an insulated gate bipolar transistor (IGBT), a bipolar junction transistor (BJT) or the like.

Figure 1A:
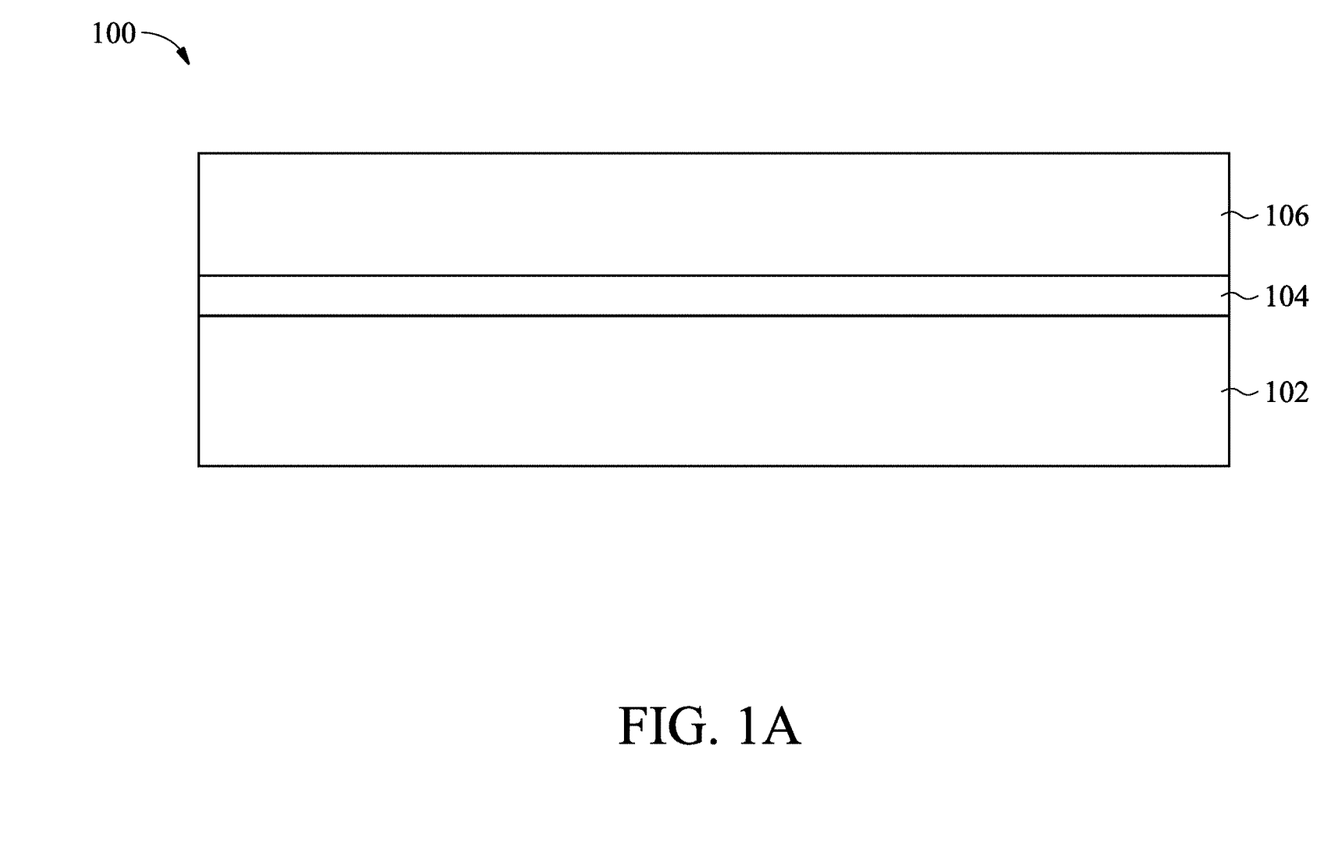
FIGS. 1A-1D are cross-sectional views illustrating a semiconductor device at various stages of manufacture in accordance with some embodiments.

FIGS. 1A-1D are cross-sectional views illustrating a semiconductor device 100 at various stages of manufacture in accordance with some embodiments of the present disclosure. As illustrated in FIG. 1A, the semiconductor device 100 includes a substrate 102. Any substrate material suitable for a semiconductor device may be used. For example, the substrate 102 may be a bulk semiconductor substrate or a composite substrate formed of different materials, and the substrate 102 may be doped (e.g., by using p-type or n-type dopants) or undoped. In some embodiments, the substrate 102 may include an elemental semiconductor substrate, a compound semiconductor substrate, or an alloy semiconductor substrate. For example, the substrate 102 may include a silicon substrate, a germanium substrate, a silicon germanium substrate, a silicon carbide (SiC) substrate, an aluminum nitride (AlN) substrate, a gallium nitride (GaN) substrate, the like, or a combination thereof.

Then, an insulating layer 104 is disposed over the substrate 102, and a semiconductor layer 106 is disposed over the insulating layer 104, in accordance with some embodiments. In some embodiments, the substrate 102, the insulating layer 104, and the semiconductor layer 106 may be formed by separation by ion implantation of oxygen (SIMOX) process, separation by plasma implantation of oxygen (SPIMOX) process, wafer bonding process, epitaxial layer transfer (ELTRAN) process, the like, or a combination thereof.

In some embodiments using the SIMOX process, oxygen ions are implanted into a wafer by using oxygen ion beam with a high energy which make the oxygen ions react with the wafer, and then an oxide layer, i.e., an insulating layer 104, is formed in the wafer by high-temperature annealing process, wherein a portion of the wafer below the insulating layer 104 and a portion of the wafer over the insulating layer 104 form the substrate 102 and the semiconductor layer 106, respectively. In some embodiments using the SPIMOX process, a method similar to SIMOX process may be used, but the oxygen ion beam is replaced by plasma to increase yield and reduce cost.

In some embodiments using the wafer bonding process, the insulating layer 104 is directly bonded to the semiconductor layer 106, and then both are bonded to the substrate 102. The semiconductor layer 106 may be thinned before being bonded to the substrate 102.

In some embodiments using the ELTRAN process, the semiconductor layer 106 is epitaxially grown on a seed layer (not shown), and the semiconductor layer 106 is oxidized to form the insulating layer 104. After bonding the insulating layer 104 to the substrate 102, the seed layer is removed.

In some embodiments, the insulating layer 104 may include a buried dielectric layer, for example, buried oxide (BOX), buried silicon oxide ($SiO_2$), and buried silicon nitride (SiN), the like, or a combination thereof.

In some embodiments, the semiconductor layer 106 may be doped by using a p-type or n-type dopant. For example, the p-type dopant may be boron, aluminum, gallium, $BF_2$, the like, or a combination thereof, and the n-type dopant may be nitrogen, phosphorus, arsenic, antimony, the like, or a combination thereof. In some embodiments, the semiconductor layer 106 may be doped by in-situ doping during epitaxial growth and/or by implanting p-type or n-type dopants after epitaxial growth.

Figure 1B:
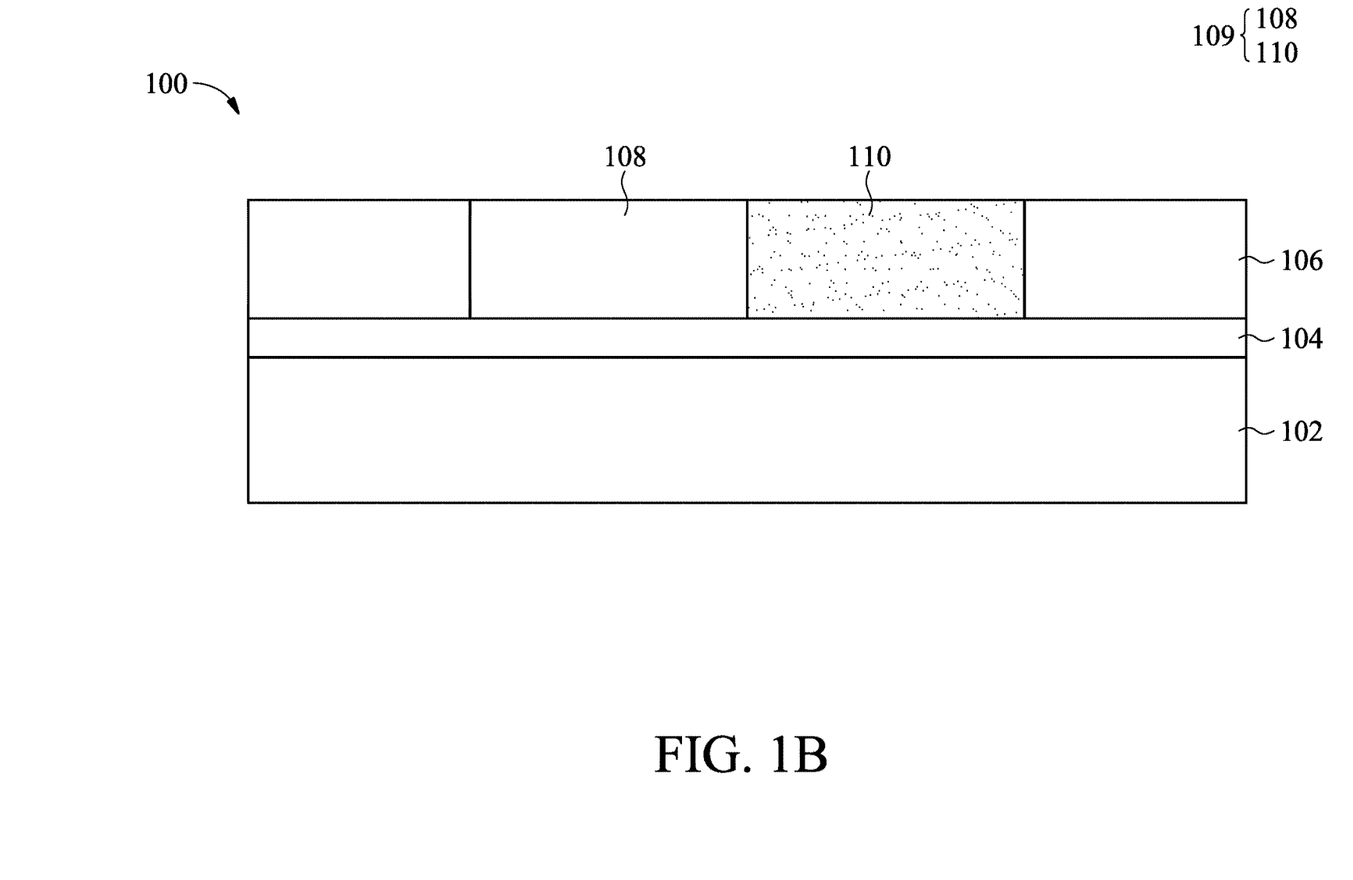

Then, as illustrated in FIG. 1B, a doped region 109 is disposed in the semiconductor layer 106, wherein the doped region 109 includes a first conductivity type doped region 108 and a second conductivity type doped region 110, and the first conductivity type doped region 108 and the second conductivity type doped region 110 have different conductivity types. In some embodiments, the LDMOS device is p-type (LDPMOS), wherein the first conductivity type doped region 108 is n-type and the second conductivity type doped region 110 is p-type. In other embodiments, the LDMOS device is n-type (LDNMOS), wherein the first conductivity type doped region 108 is p-type and the second conductivity type doped region 110 is n-type.

In some embodiments, a mask layer (not shown) may be formed and patterned to cover the semiconductor device 100 before doping the first conductivity type doped region 108 and the second conductivity type doped region 110 to cover areas which need to be protected from implantation and to achieve different implantation steps for the first conductivity type doped region 108 and the second conductivity type doped region 110. In some embodiments, the mask layer may be a photoresist, for example, a positive photoresist or a negative photoresist. In other embodiments, the mask layer may be a hard mask, for example, silicon oxide, silicon nitride, silicon oxynitride, silicon carbide, silicon carbonitride, the like, or a combination thereof. In some embodiments, the mask layer may be formed by spin-on coating, physical vapor deposition (PVD), chemical vapor deposition (CVD), atomic layer deposition (ALD), the like, or a combination thereof, and the mask layer may be patterned by using suitable lithography techniques.

A portion of the semiconductor layer 106 which is not covered by the mask layer are then implanted to form the first conductivity type doped region 108 and the second conductivity type doped regions 110, respectively. The position of the first conductivity type doped region 108 and the second conductivity type doped region 110 may be adjusted according to the predetermined position of a device region. The doping concentration of the first conductivity type doped region 108 and the second conductivity type doped region 110 is higher than the doping concentration of the semiconductor layer 106. The mask layer is then removed.

Figure 1C:
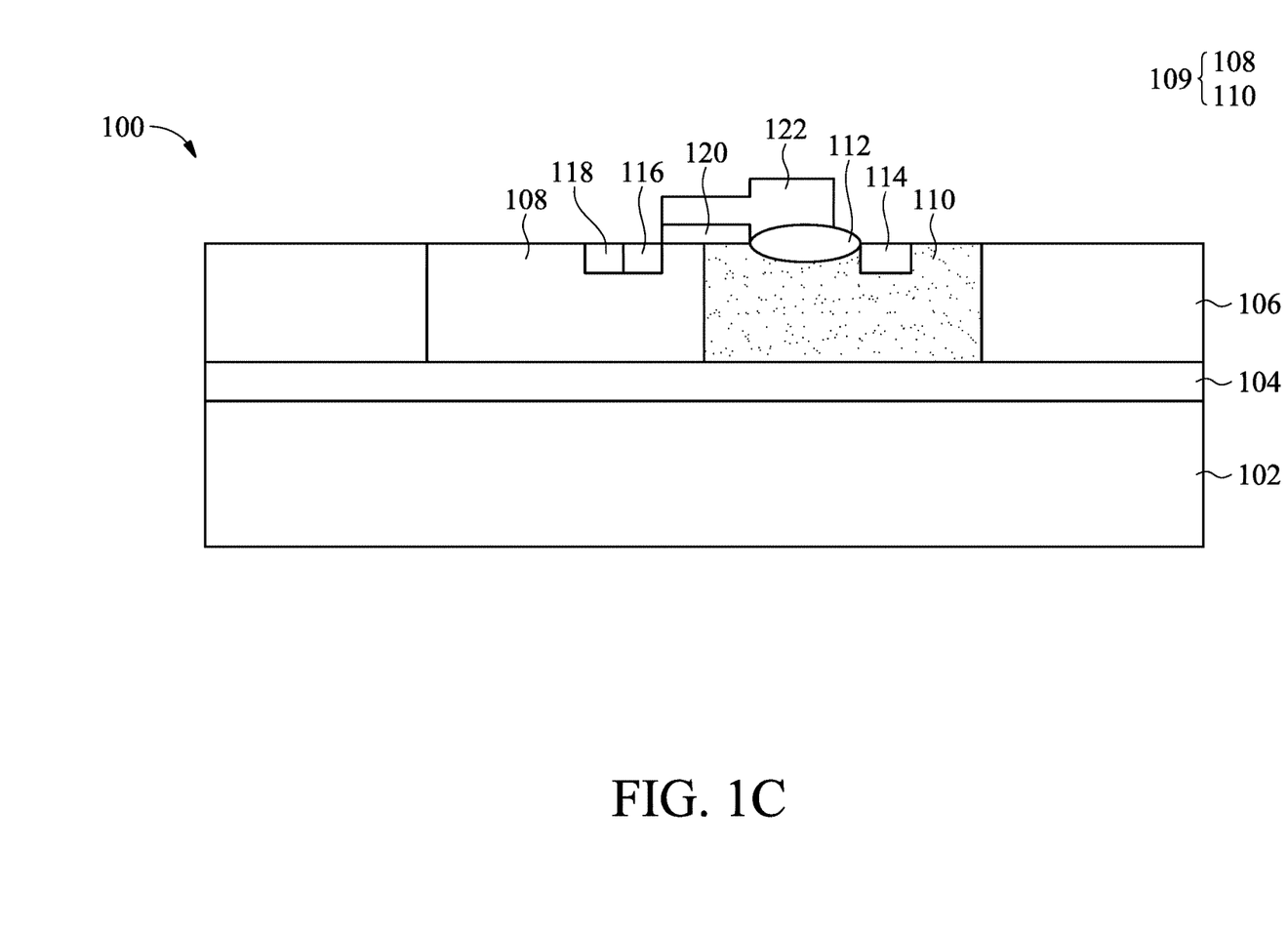

Then, as illustrated in FIG. 1C, a source 116 and a body contact 118 are disposed in the first conductivity type doped region 108, and a field oxide layer 112 and a drain 114 are disposed in the second conductivity type doped region 110. In some embodiments, the source 116, the drain 114, and the body contact 118 may be formed by ion implantation process with a mask layer (not shown). The material and formation of the mask layer may be as described above, but other materials and formation may also be used. In some embodiments, the source 116 and the drain 114 may be formed simultaneously by an ion implantation process, and the body contact 118 may be formed by another ion implantation process. In other embodiments, the source 116, the drain 114, and the body contact 118 may be formed individually by different ion implantation processes.

The source 116 and the drain 114 have the same conductivity type, and the body contact 118 has another conductivity type. In the embodiments where the LDMOS device is p-type (LDPMOS), the source 116 and the drain 114 are p-type and the body contact 118 is n-type. In the embodiments where the LDMOS device is n-type (LDNMOS), the source 116 and the drain 114 are n-type and the body contact 118 is p-type.

The doping concentration of the source 116, the drain 114, and the body contact 118 is greater than the doping concentration of the first conductivity type doped region 108 and the second conductivity type doped region 110.

A field oxide layer 112 is then disposed on the second conductivity type doped region 110. In some embodiments, the field oxide layer 112 may be formed by using thermal oxidation or the like. In other embodiments, the field oxide layer 112 may also be formed by a shallow trench isolation (STI) process or the like. In some embodiments, the field oxide layer 112 abuts the source 116, but there may also be a gap between the field oxide layer 112 and the source 116. Furthermore, in some embodiments, the depth of the field oxide layer 112 is less than the depth of the source 116, but the depth of the field oxide layer 112 may also be greater than or equal to the depth of the source 116.

A gate dielectric layer 120 is then disposed between the field oxide layer 112 and the source 116, and a gate electrode layer 122 is disposed over the field oxide layer 112 and the gate dielectric layer 120. In some embodiments, the material of the gate dielectric layer 120 may include silicon oxide, silicon nitride, silicon oxynitride, the like, or a combination thereof. In some embodiments, the gate dielectric layer 120 may be formed by using an oxidation process, a deposition process, the like, or a combination thereof. For example, the oxidation process includes dry oxidation process or wet oxidation process, and the deposition process includes chemical deposition process. In some embodiments, the gate dielectric layer 120 may be formed by using a thermal oxidation process or the like.

In some embodiments, the material of the gate dielectric layer 120 may include a high-k dielectric material, that is, a dielectric material with a dielectric constant greater than 3.9. For example, the material of the gate dielectric layer 120 may include $HfO_2$, $LaO_2$, $TiO_2$, $ZrO_2$, $Al_2O_3$, $Ta_2O_3$, HfZrO, $ZrSiO_2$, $HfSiO_4$, the like, or a combination thereof. The gate dielectric layer 120 may be formed by PVD, CVD, ALD, the like, or a combination thereof.

A conductive material is then deposited over the field oxide layer 112 and the gate dielectric layer 120, and a patterned process is performed on the deposited conductive material and the gate dielectric layer 120 to form the gate dielectric layer 120 and the gate electrode layer 122 having a common sidewall at desired locations.

In some embodiments, the deposition process of the conductive material may include PVD, CVD, ALD, molecular beam epitaxy (MBE), liquid phase epitaxy (LPE), vapor phase epitaxy (VPE), the like, or a combination thereof. In some embodiments, the conductive material may include metal, metal silicide, semiconductor material, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, a multilayer structure thereof, or a combination thereof, and the semiconductor material may include polycrystalline silicon (poly-Si) or polycrystalline germanium (poly-Ge).

Although the formation sequences of the field oxide layer 112, the source 116, the drain 114, the body contact 118, the gate dielectric layer 120, and the gate electrode layer 122 are described above, the present disclosure is not limited thereto, and these elements may be formed by other formation sequences. In addition, shapes of the source 116, the drain 114, the body contact 118, the gate dielectric layer 120, and the gate electrode layer 122 are not limited to the vertical sidewalls as illustrated in the figures, and may have inclined sidewalls or sidewalls having other shape. An upper surface of the gate electrode layer 122 is not limited to the stepped shape as illustrated in the figures, and may have a substantially flat upper surface or an upper surface having other shape.

Figure 1D:
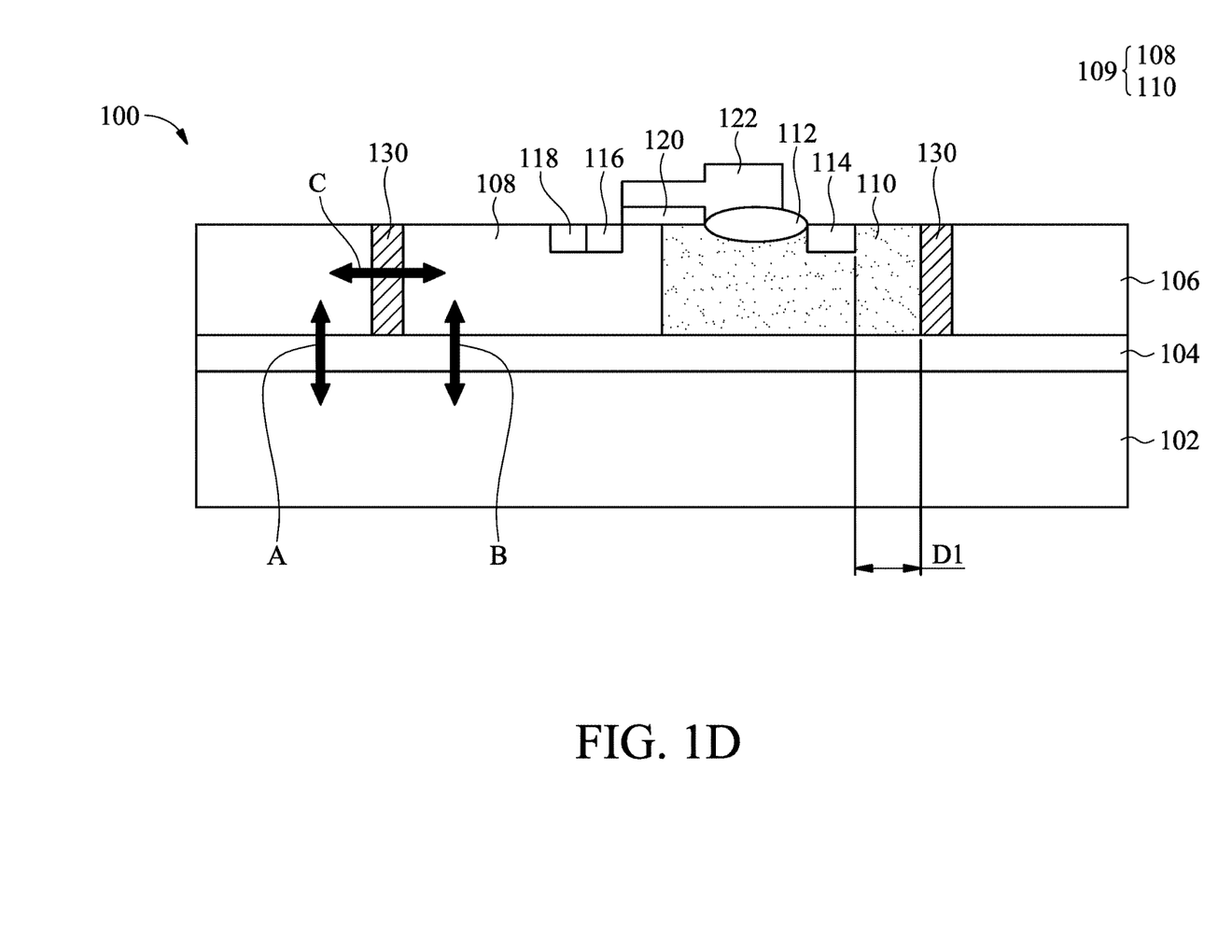

Then, as illustrated in FIG. 1D, a first isolation structure 130 is provided. In some embodiments, the first isolation structure 130 may include a deep trench isolation (DTI) structure. In some embodiments, a mask layer (not shown) is provided to expose a predetermined position of the first isolation structure 130, and the semiconductor layer 106 is etched to form a trench (not shown) by an etching process, and then an insulating material is deposited in the trench to form the first isolation structure 130. In some embodiments, the trench may pass through the semiconductor layer 106 and expose the insulating layer 104 such that a bottom of the first isolation structure 130 is in contact with the insulating layer 104 or penetrate into the insulating layer 104.

The material and formation of the mask layer may be as described above, but other materials and formation may also be used. In some embodiments, the etching process may be a dry etching process, a wet etching process, or a combination thereof, such as reactive ion etching (RIE), inductively-coupled plasma (ICP) etching, neutral beam etch (NBE), electron cyclotron resonance (ERC) etching, the like, or a combination thereof. In some embodiments, the deposition process may include metal-organic CVD (MOCVD), ALD, MBE, LPE, the like, or a combination thereof. In some embodiments, the insulating material may include an oxide such as silicon oxide, a nitride such as silicon nitride, the like, or a combination thereof. In addition, the first isolation structure 130 is not limited to vertical sidewalls, and may have inclined sidewalls or sidewalls having other shape.

Figure 1E:
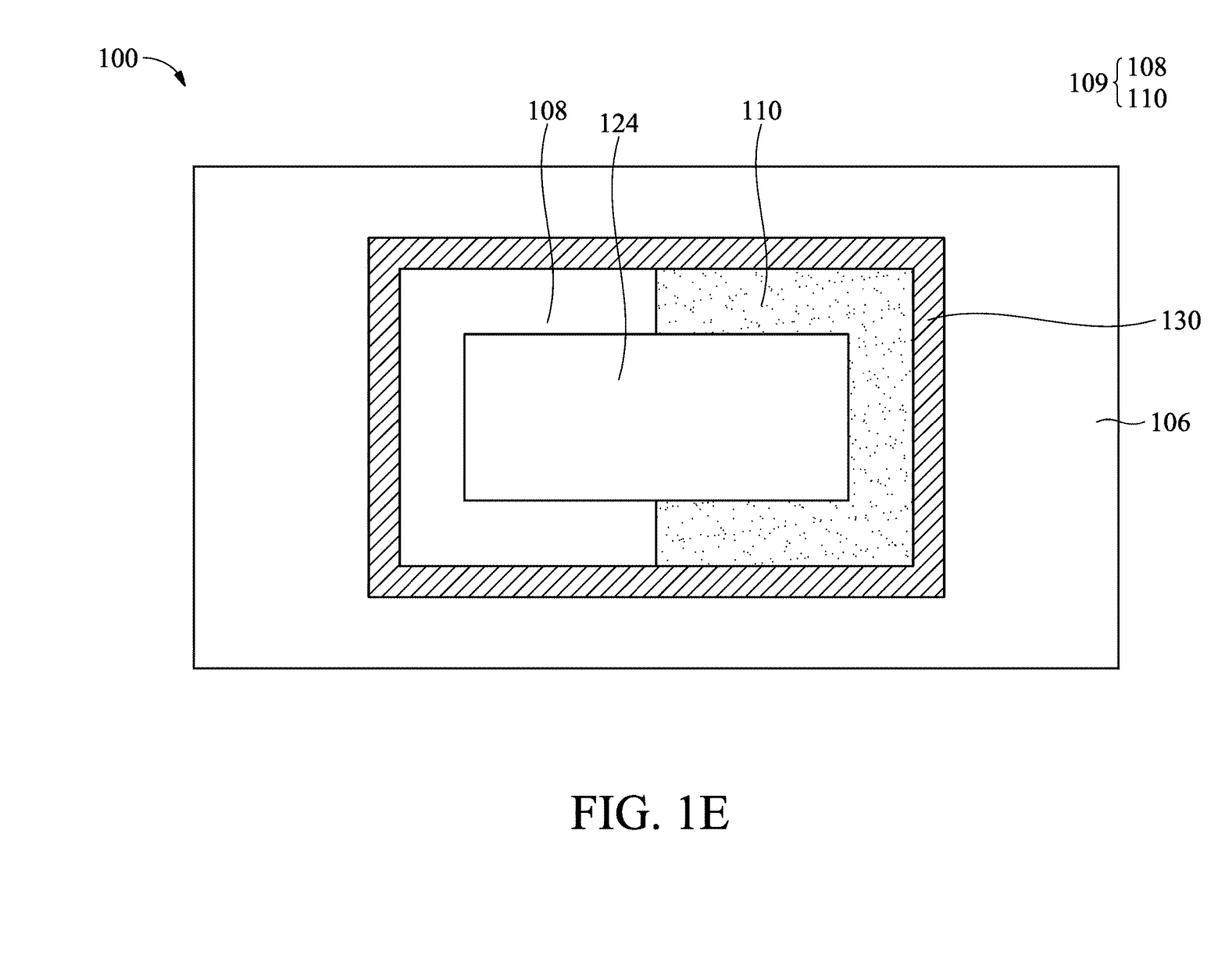
FIG. 1E is a top view illustrating a semiconductor device in accordance with some embodiments.

In some embodiments, a minimum spacing between the first isolation structure 130 and the device region 124 (as illustrated in FIG. 1E) is a first spacing D1. In some embodiments, as illustrated in FIG. 1D, the first spacing D1 may be the distance between the first isolation structure 130 and the drain 114, but the present disclosure is not limit thereto, and the first spacing D1 may be the spacing between the first isolation structure 130 and other elements. For example, the first spacing D1 may be the spacing between the first isolation structure 130 and the body contact 118. If the first spacing D1 is too small, the voltage applied outside the first isolation structure 130 may affect the device region 124 inside the first isolation structure 130. If the first spacing D1 is too large, space is wasted unnecessarily. A range of the first spacing D1 may be adjusted to reduce the interference on the device region 124 while making the semiconductor device 100 have a smaller volume.

FIG. 1E is a top view of a semiconductor device 100 in accordance with some embodiments. As illustrated in FIG. 1E, the semiconductor device 100 includes a device region 124, wherein the device region 124 includes the field oxide layer 112, the source 116, the drain 114, the body contact 118, the gate dielectric layer 120 and the gate electrode layer 122 as illustrated in FIGS. 1C to 1D. In addition, the first isolation structure 130 surrounds the doped region 109 including the first conductivity type doped region 108 and the second conductivity type doped region 110, and is spaced apart from the device region 124 by a portion of the semiconductor layer 106.

Although the first isolation structure 130 is illustrated as a rectangle from the top view, the present disclosure is not limited thereto, and the first isolation structure 130 may have other shapes, for example, circle, oval, or other loop shape.

When the semiconductor device 100 is used for applications such as ultrasonic medical applications, the substrate 102 needs to be backside biased. However, the bias voltage may couple additional charges on the surface of the insulating layer 104 on both sides of the first isolation structure 130, which changes the electric field distribution of the semiconductor device 100, that is, a backside bias effect, as indicated by arrows A and B. In addition, the first isolation structure 130 also has a horizontal coupling effect, as indicated by the arrow C, causing problems such as an increase in the magnitude of leakage current and deterioration of hot carrier injection, etc., thereby limiting the safe operation interval of the semiconductor device 100. Therefore, the present disclosure further provides the following embodiments to improve the above problems.

Figure 2A:
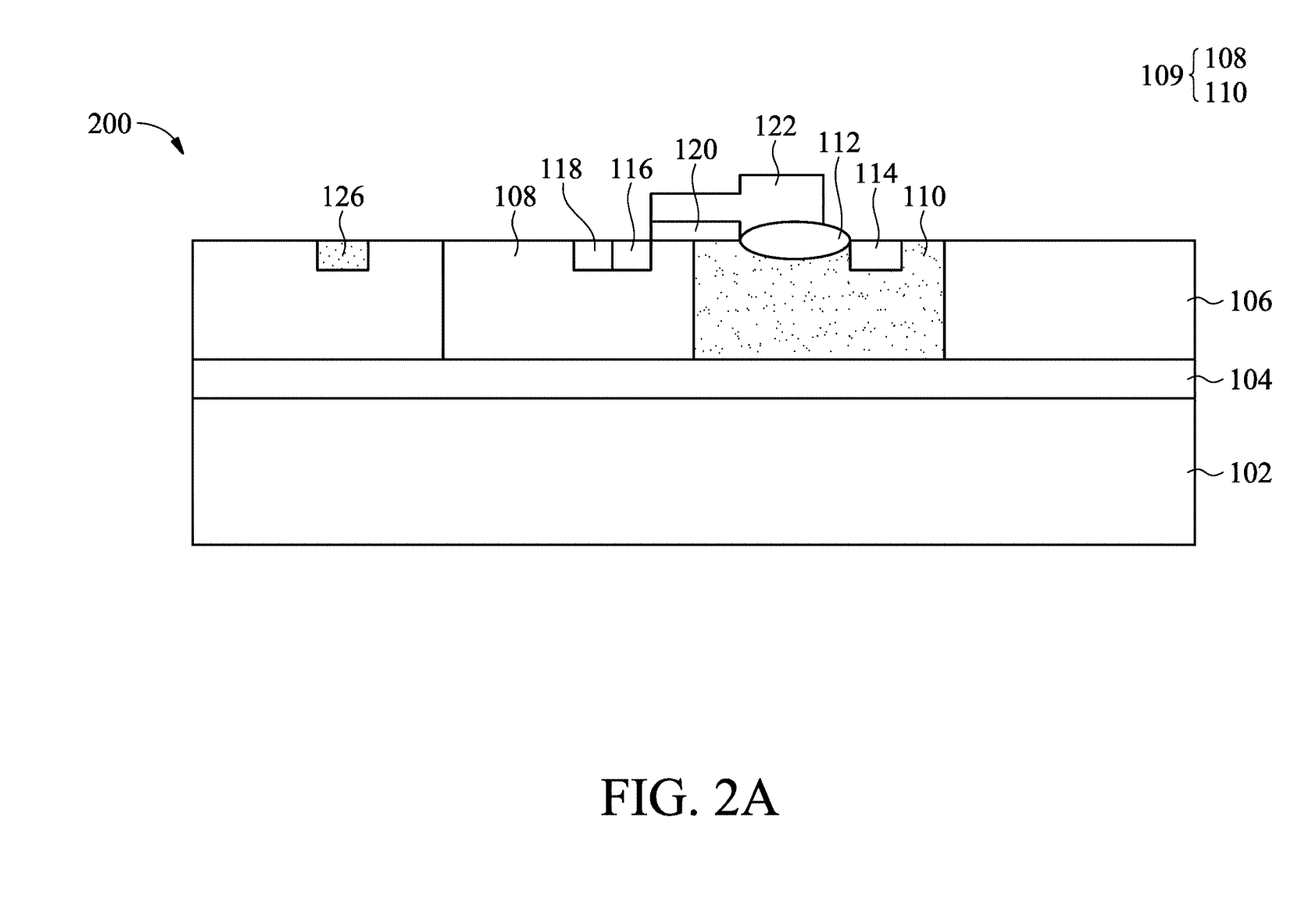
FIGS. 2A-2C are cross-sectional views illustrating a semiconductor device at various stages of manufacture in accordance with another embodiments.
Figure 2B:
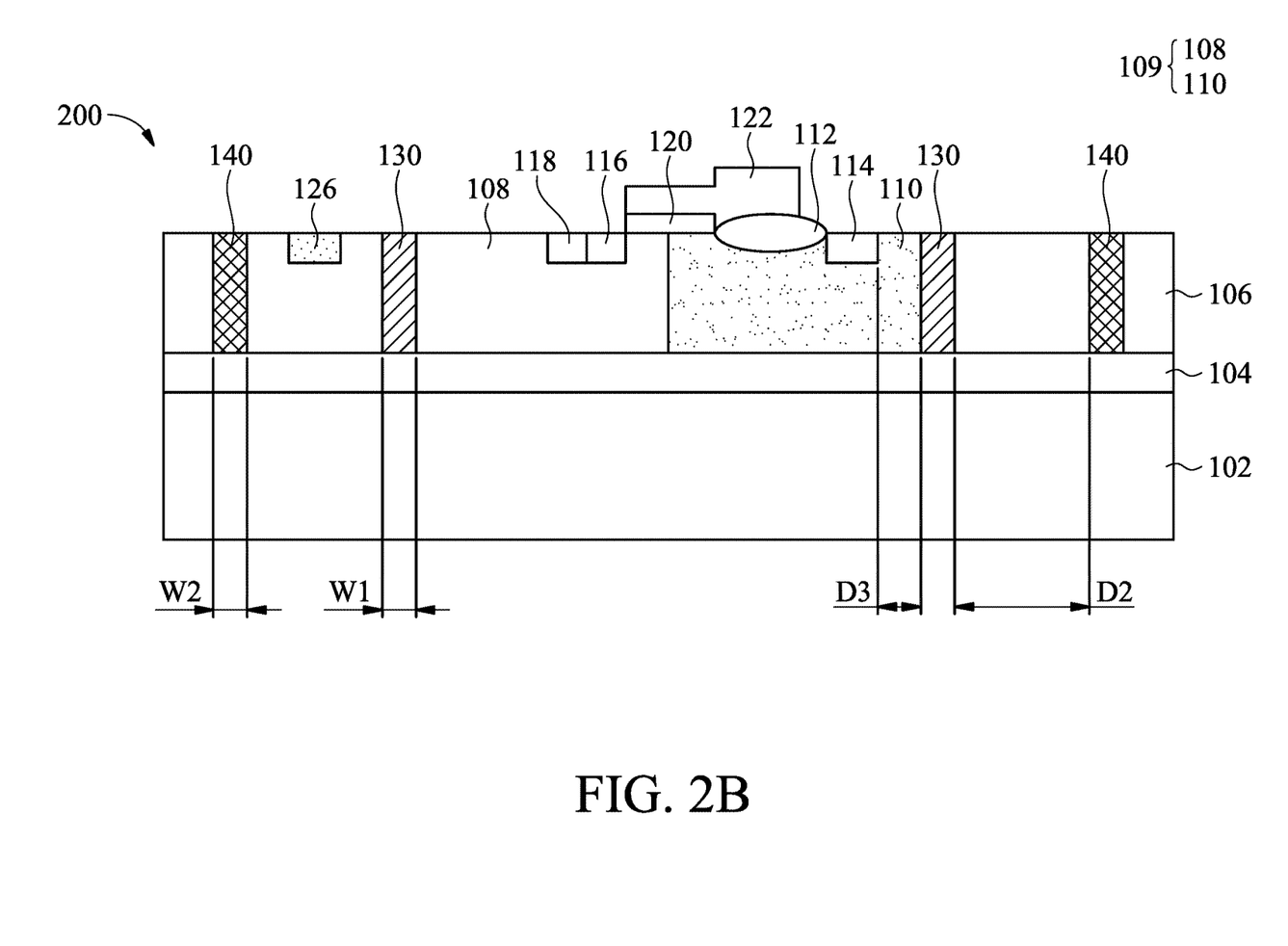
Figure 2C:
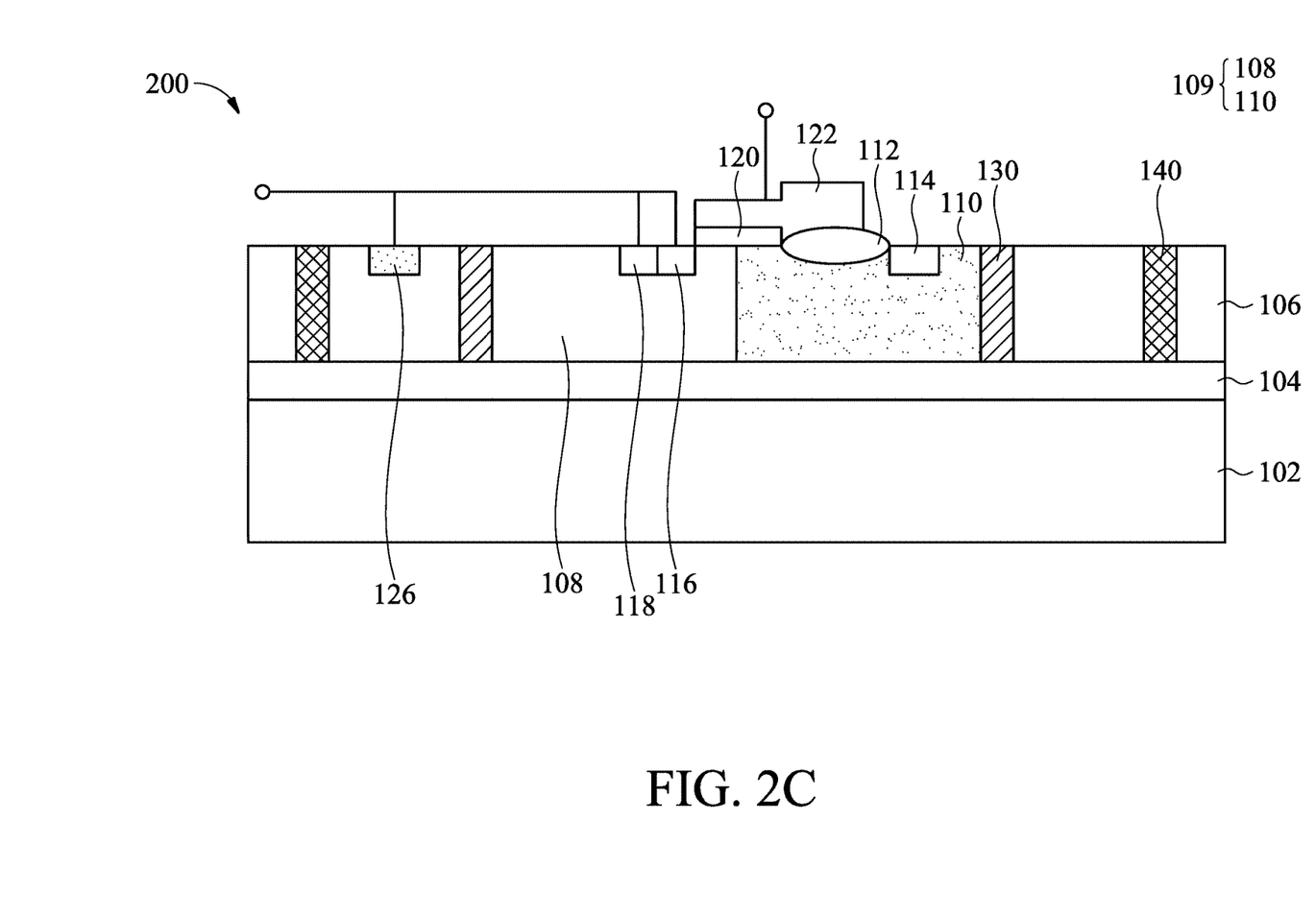

FIGS. 2A-2C are cross-sectional views showing a semiconductor device 200 in accordance with other embodiments. FIG. 2A is a continuation of the process steps of FIG. 1C. For simplicity, the same elements are described below with the same reference numerals. The formation and materials of these elements are as described above, and will not be repeated again. Compared to the embodiments illustrated in FIGS. 1A-1E, the following embodiments have additional components to enhance the reliability of the semiconductor device.

As illustrated in FIG. 2A, a terminal 126 is provided in the semiconductor layer 106 of the semiconductor device 200. In some embodiments, the terminal 126 may be formed by using an ion implantation process with a mask layer (not shown). The material and formation of the mask layer may be as described above, but other materials and formation may also be used.

In some embodiments, the terminal 126 may be formed when forming the source 116, the drain 114, and the body contact 118. For example, in some embodiments, the terminal 126, the source 116, and the drain 114 may be formed by an ion implantation process, and the body contact 118 may be formed by another ion implantation process. In other embodiments, the source 116 and the drain 114 may be formed by an ion implantation process, and the terminal 126 and the body contact 118 may be formed by another ion implantation process. However, the present disclosure is not limited thereto, and the source 116, the drain 114, the body contact 118, and the terminal 126 may be individually formed by a plurality of ion implantation processes. In still other embodiments, additional mask layers and additional ion implantation process may be used to forms the terminal 126 after forming the source 116, the drain 114, the body contact 118, the field oxide layer 112, the gate dielectric layer 120, and the gate electrode layer 122. Other formation sequences may be employed.

A doping concentration of the terminal 126 is greater than a doping concentration of the first conductivity type doped region 108 and the second conductivity type doped region 110, and the doping concentration of the terminal 126 may be the same as or different from the doping concentration of the source 116, the doping concentration of the drain 114 and the doping concentration of the body contact 118. The doping concentration of the terminal 126 may be adjusted such that the terminal 126 has good electrical conductivity while the effect of dopants therein on surrounding components remains small. A width of the terminal 126 may be adjusted so that the terminal 126 may be well bonded to the external conductive structure of the terminal 126 without increasing the volume of the semiconductor device 200.

As illustrated in FIG. 2A, in some embodiments, the terminal 126 is adjacent to the first conductivity type doped region 108 and away from the second conductivity type doped region 110, but the present disclosure is not limited thereto. In other embodiments, the terminal 126 may be disposed adjacent to the second conductivity type doped region 110 and away from the first conductivity type doped region 108 or be disposed at other locations.

Then, as illustrated in FIG. 2B, a first isolation structure 130 and a second isolation structure 140 are disposed in the semiconductor layer 106. In some embodiments, the first isolation structure 130 and the second isolation structure 140 may individually include deep trench isolation structures. As illustrated in FIG. 2B, the first isolation structure 130 and the second isolation structure 140 are spaced apart by a portion of the semiconductor layer 106, and the terminal 126 is located on the semiconductor layer 106 between the first isolation structure 130 and the second isolation structure 140.

The material and formation of the second isolation structure 140 may be selected from the materials and formation of the first isolation structure 130 as described above, but the first isolation structure 130 and the second isolation structure 140 may independently use the same or different materials and formation. A width W1 of the first isolation structure 130 and a width W2 of the second isolation structure 140 may be the same or different. In some embodiments, the first isolation structure 130 and the second isolation structure 140 may be formed simultaneously, and the first isolation structure 130 and the second isolation structure 140 have the same material. However, the present disclosure is not limited thereto, and the second isolation structure 140 may be formed before or after the first isolation structure 130 is formed. In addition, the first isolation structure 130 and the second isolation structure 140 are not limited to the vertical sidewalls as illustrated in the figure, and may also have inclined sidewalls or sidewalls having other shape. The sidewall of the first isolation structure 130 and the sidewall of the second isolation structure 140 may have the same or different shapes.

As described above, in some embodiments, the trench for forming the first isolation structure 130 and the second isolation structure 140 may pass through the semiconductor layer 106 and expose the insulating layer 104 such that the bottoms of the first isolation structure 130 and the second isolation structures 140 may individually in contact with the insulating layer 104 or penetrate into the insulating layer 104.

In some embodiments, the first isolation structure 130 and the second isolation structure 140 may have the same or different spacing at different locations. The minimum spacing between the first isolation structure 130 and the second isolation structure 140 is a second spacing D2.

Figure 2D:
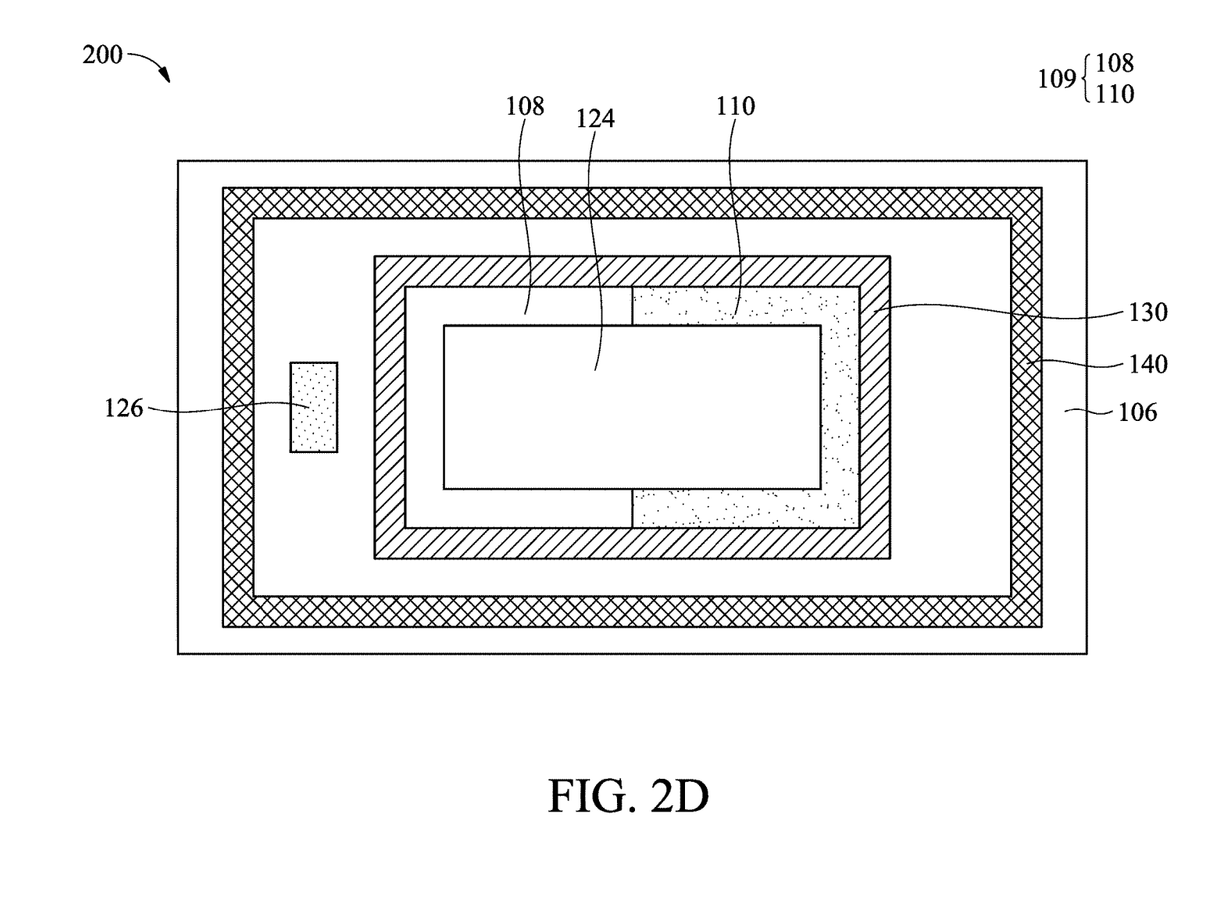
FIG. 2D is a top view illustrating a semiconductor device in accordance with another embodiments.

In some embodiments, the minimum spacing between the first isolation structure 130 and the device region 124 (as illustrated in FIG. 2D) is a third spacing D3. In some embodiments, as illustrated in FIG. 2B, the third spacing D3 may be the spacing between the first isolation structure 130 and the drain 114. However, the present disclosure is not limited thereto, and the third spacing D3 may be the spacing between the first isolation structure 130 and other elements. For example, the third spacing D3 may be the spacing between the first isolation structure 130 and the body contact 118.

As illustrated in FIG. 2C, the terminal 126 and the source 116 are connected in common to be equipotential. Since the terminal 126 and the source 116 are respectively disposed on inside and outside of the first isolation structure 130, setting the terminal 126 and the source 116 to be equipotential can make inside and outside of the first isolation structure 130 equipotential, thereby eliminating interference on the device region 124 inside the first isolation structure 130 which caused by voltage applied to the outside of the first isolation structure 130. Therefore, the leakage current can be reduced and the hot carrier injection effect can be improved, and the reliability and safe operation interval of the semiconductor device 200 can be improved.

In addition, in the semiconductor device 100 with only the first isolation structure 130, the first isolation structure 130 may be spaced apart from the device region 124 to reduce the interference with the device region 124. Contrarily, in the semiconductor device 200, since the second isolation structure 140 and the terminal 126 connected to the source are disposed, the interference with the device region 124 can be reduced, and the minimum spacing between the first isolation structure 130 and the device region 124 (i.e., the third spacing D3) can be shortened. In other words, compared to the semiconductor device 100 in which only the first isolation structure 130 is disposed, the semiconductor device 200 has the second isolation structure 140 and the terminal 126, thereby the third spacing D3 of the semiconductor device 200 can be smaller than the first spacing D1 of the semiconductor device 100.

In some embodiments, at a bias voltage of −180 volts (V) applied to the substrate 102, as compared to ungrounded, under the conditions of grounding the substrate 102 outside the first isolation structure 130, the maximum value of the gate current (Ig) can be reduced by about 37%, showing a significant improvement in the hot carrier injection effect. In addition, in some embodiments, under the condition of grounding the substrate 102 outside the first isolation structure 130, the breakdown voltage of the on state can be increased by about 10 to 30 V, and the safe operation interval of the display semiconductor device 200 is also improved.

FIG. 2D is a top view of semiconductor device 200 in accordance with some embodiments. As illustrated in FIG. 2D, the first isolation structure 130 surrounds the doped region 109, including the first conductivity type doped region 108 and the second conductivity type doped region 110, and the device region 124, and the second isolation structure 140 surrounds the first isolation structure 130, wherein the second isolation structure 140 is spaced apart from the first isolation structure 130 by a portion of the semiconductor layer 106. Although the first isolation structure 130 and the second isolation structure 140 are viewed as a rectangle from the top view, the present disclosure is not limited thereto. The first isolation structure 130 and the second isolation structure 140 may have other shapes, such as circle, oval, or other loop shape, and the first isolation structure 130 and the second isolation structure 140 may have the same or different shapes.

In addition, the description of FIGS. 1A to 2D is to provide an isolation structure after forming the device. That is, the formation sequences of the semiconductor devices 100 and 200 are providing the substrate 102, the insulating layer 104, and the semiconductor layer 106, and then sequentially forms the doped region 109, the device region 124, and the two isolation structures (the first isolation structure 130 and the second isolation structure 140), but the present disclosure is not limited thereto. For example, the device may be disposed after the isolation structure is formed. That is, the substrate 102, the insulating layer 104, and the semiconductor layer 106 are provided, and then the two isolation structures (the first isolation structure 130 and the second isolation structure 140), the doped region 109, and the device region 124 are sequentially formed.

The first isolation structure 130 and the second isolation structure 140 of the present disclosure are also applicable to a semiconductor device having a plurality of device regions. Example configurations of the semiconductor device having a plurality of device regions are described below in accordance with some embodiments. For simplicity, same elements are described with same symbols, and labels of A, B, C, and D are added to the symbols to distinguish the elements. The formation and materials of the elements are as described above, and will not be repeated again.

Figure 3:
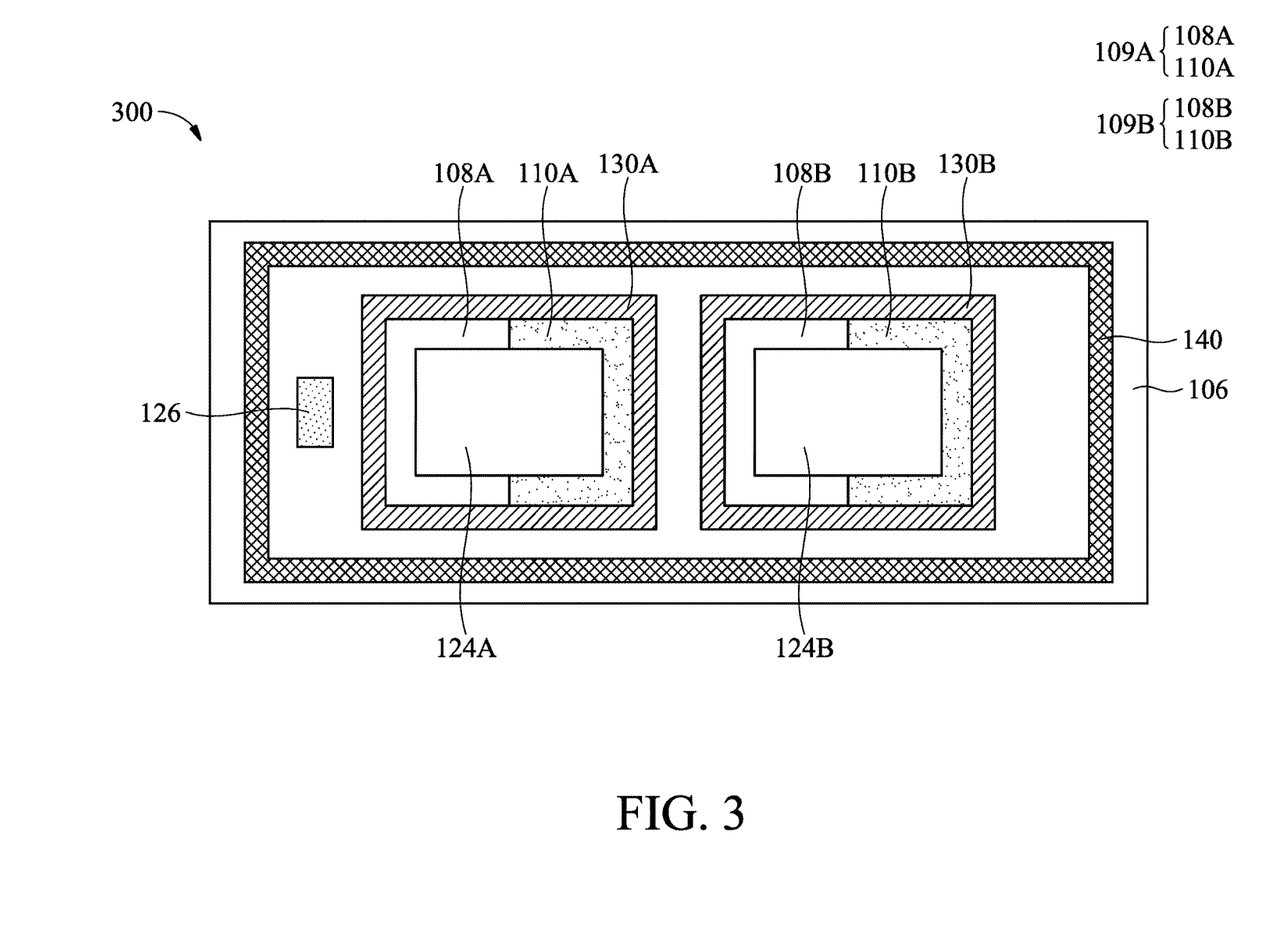
FIGS. 3-5 are top views illustrating a semiconductor device in accordance with another embodiments.

FIG. 3 is a top view of a semiconductor device 300 in accordance with some embodiments. FIG. 3 illustrates an example configuration including device regions with the same conductivity type. In some embodiments, as illustrated in FIG. 3, the semiconductor device 300 includes device regions 124A and 124B having the same conductivity type. The device regions 124A and 124B may have the configuration of the device region 124 as described above. For example, the device regions 124A and 124B may include the field oxide layer 112, the source 116, the drain 114, the body contact 118, the gate dielectric layer 120, and the gate electrode layer 122. The device regions 124A and 124B may have the same or different configurations.

In some embodiments, the semiconductor device 300 includes doped regions 109A and 109B, wherein the doped region 109A includes the first conductivity type doped region 108A and the second conductivity type doped region 130A, and the doped region 109B includes the first conductivity type doped region 108B and the second conductivity type doped region 130B. In some embodiments, the device regions 124A and 124B are disposed over the doped regions 109A and 109B, respectively. In some embodiments, the semiconductor device 300 includes the first isolation structures 130A and 130B to surround the doped regions 109A and 109B, respectively.

As previously mentioned, in some embodiments, the device regions 124A and 124B have the same conductivity type, so a terminal 126 may be provided to simultaneously connect the sources in the device regions 124A and 124B, and a second isolation structure 140 is provided to simultaneously surrounds the first isolation structures 130A and 130B to reduce process steps and reduce cost. However, the present disclosure is not limited thereto, and two terminals 126 may be provided to respectively connect the sources in the device regions 124A and 124B, and two second isolation structures 140 may be provided to surround the first isolation structures 130A and 130B, respectively.

As illustrated in FIG. 3, the terminal 126 is adjacent to the first isolation structure 130A in accordance with some embodiments, but the present disclosure is not limited thereto. For example, the terminal 126 may be disposed between the first isolation structures 130A and 130B or be disposed adjacent to the first isolation structure 130B. Furthermore, the doped regions 109A and 109B may have the same or different configurations. For example, first conductive types 108A and 108B are located on different sides of the first isolation structures 130A and 130B.

Figure 4:
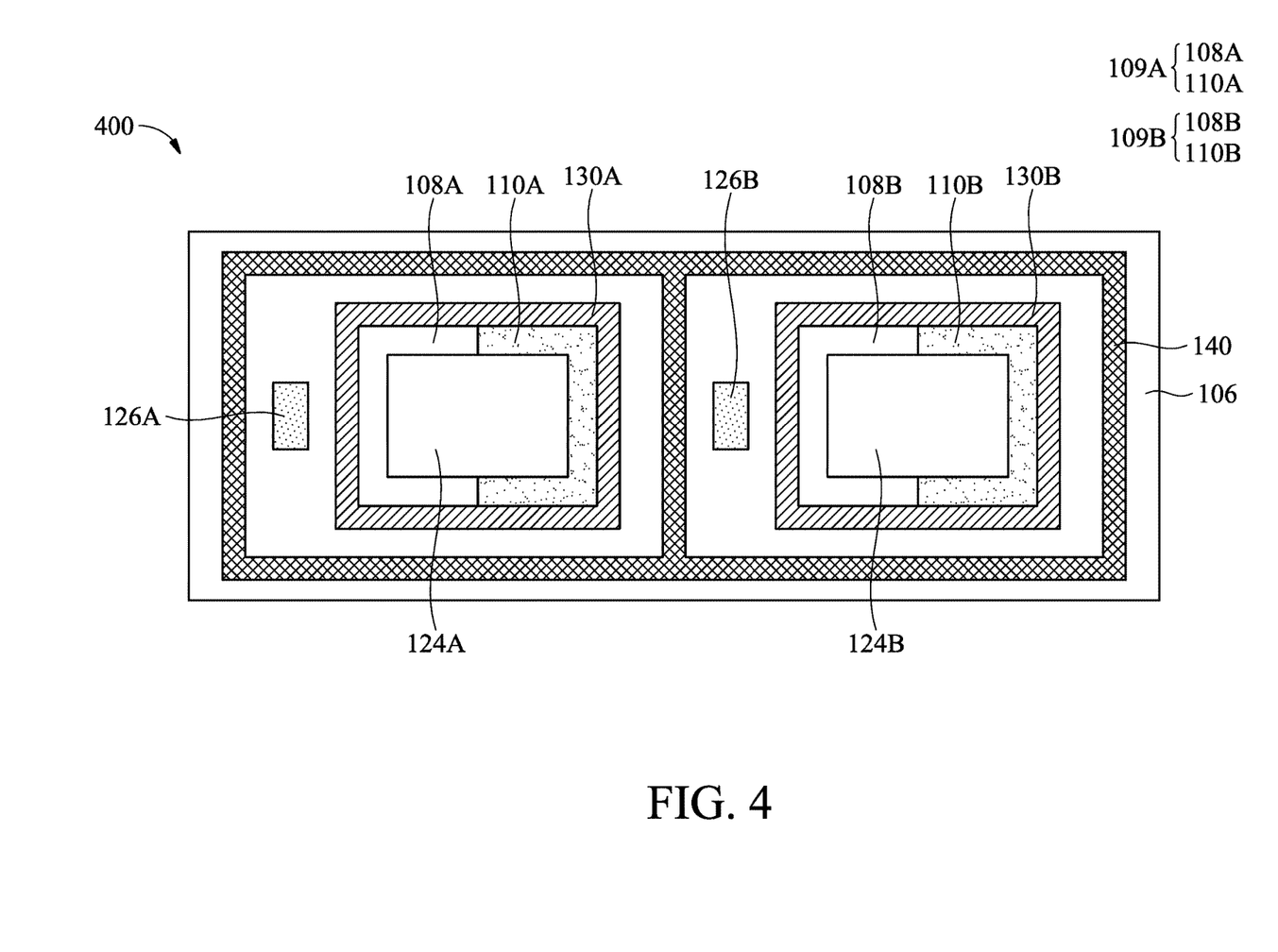

FIG. 4 is a top view of a semiconductor device 400 in accordance with some embodiments. FIG. 4 illustrates an example configuration including device regions having different conductivity types. The configuration of FIG. 4 is similar to that of FIG. 3, but the device regions 124A and 124B in FIG. 4 have different conductivity types, and other elements may be referred to FIG. 3 and related description. The semiconductor device 400 includes two terminals 126A and 126B to respectively connect the sources in the device regions 124A and 124B, and the semiconductor device 400 includes two second isolation structures 140 juxtaposed, wherein the two terminals 126A and 126B are respectively located at the two second isolation structures 140.

As illustrated in FIG. 4, the terminals 126A and 126B are located on the same side of the first isolation structures 130A and 130B, respectively, in accordance with some embodiments, but the present disclosure is not limited thereto. For example, the terminals 126A and 126B may be disposed between the first isolation structures 130A and 130B or may be disposed on opposite sides of the first isolation structures 130A and 130B, respectively. Furthermore, the two second isolation structures 140 are not limited to being juxtaposed, they may have gaps, and may have the same or different shapes.

Figure 5:
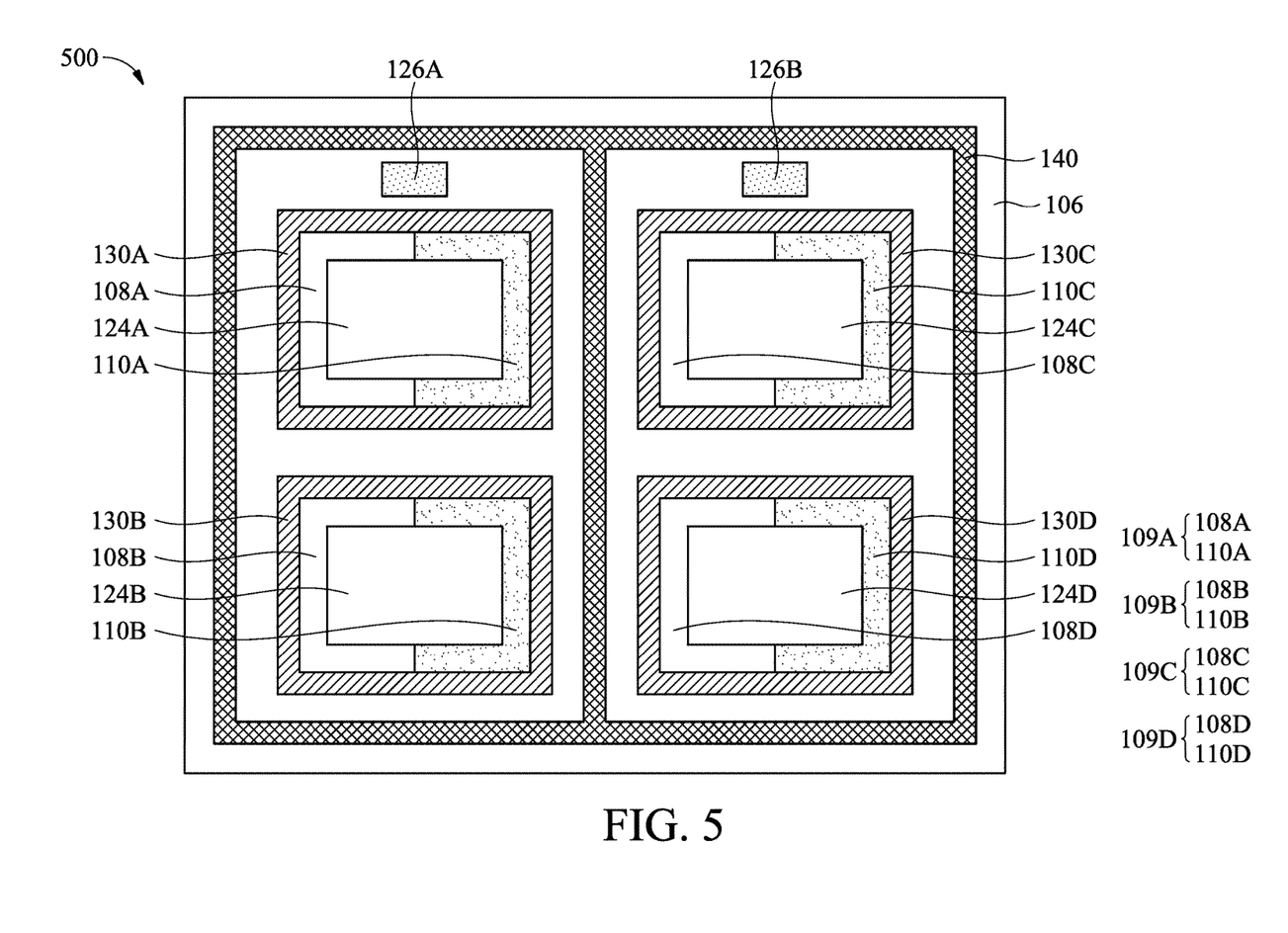

FIG. 5 is a top view of a semiconductor device 500 in accordance with some embodiments. FIG. 5 illustrates an example configuration including device regions having the same and different conductivity types. In some embodiments, the semiconductor device 500 includes first device regions (also referred to as device regions) 124A and 124B having the same conductivity type and second device regions 124C and 124D (also referred to as device regions) having different conductivity types, and includes two terminals 126A and 126B to connect the sources in the first device regions 124A and 124B and the sources in the second device regions 124C and 124D, respectively. In addition, the semiconductor device 500 includes two second isolation structures 140 juxtaposed, wherein the two terminals 126A and 126B are respectively located in the two second isolation structures 140.

As described above, the shape and the configuration of the device regions 124A, 124B, 124C, and 124D, the terminals 126A and 126B, the doped regions 109A, 109B, 109C, and 109D, the first conductivity type doped regions 108A, 108B, 108C, and 108D, and the second conductivity type doped regions 110A, 110B, 110C, and 110D, the first isolation structures 130A, 130B, 130C, and 130D are not limited to the example shape and configuration of the semiconductor device 500, and these components may have different locations and shapes, and additional components may be set. For example, in some embodiments, four second isolation structures 140 may be used to separate the device regions 124A, 124B, 124C, and 124D, and four terminals may be provided to connect the device regions 124A, 124B, 124C, and 124D, respectively.

According to some embodiments of the present disclosure, a first isolation structure and a second isolation structure are disposed on a semiconductor device, and a terminal connected in common with a source is disposed between the first isolation structure and the second isolation structure, so that inside and outside of the first isolation structure can be equipotential, thereby eliminating interference on the internal components caused by voltage applied to the outside of the isolation structure, therefore reducing leakage current and improving hot carrier injection effect, and thereby improving reliability of the semiconductor device and safe operation interval.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced does not depart from the spirit and scope of the disclosure. Therefore, the scope of protection of the present disclosure is defined as the subject matter set forth in the appended claims.

What is claimed is:

1. A semiconductor device, comprising:
a semiconductor layer disposed over a substrate;
a doped region disposed in the semiconductor layer;
a device region disposed on the doped region, and comprising a source, a drain and a gate;
a first isolation structure disposed in the semiconductor layer and surrounding the doped region, wherein the device region is in the first isolation structure;
a second isolation structure surrounding the first isolation structure and spaced apart from the first isolation structure; and
a terminal disposed between the first isolation structure and the second isolation structure, and being equipotential with the source, wherein the terminal is outside the first isolation structure.

2. The semiconductor device as claimed in claim 1, wherein the first isolation structure and the second isolation structure are spaced apart by a portion of the semiconductor layer.

3. The semiconductor device as claimed in claim 1, wherein the doped region comprises a first conductivity type doped region adjacent to the terminal and a second conductivity type doped region away from the terminal, wherein the first conductivity type doped region and the second conductivity type doped region have different conductivity types.

4. The semiconductor device as claimed in claim 3, wherein the source is disposed over the first conductivity type doped region and the drain is disposed over the second conductivity type doped region.

5. The semiconductor device as claimed in claim 1, further comprising:
a plurality of first device regions disposed on a plurality of first doped regions; and
a plurality of first isolation structures disposed in the semiconductor layer, wherein each of the plurality of first isolation structures respectively surrounds each of the plurality of first doped regions.

6. The semiconductor device as claimed in claim 5, wherein the second isolation structure surrounds the plurality of first isolation structures and is spaced apart from each of the plurality of first isolation structures.

7. The semiconductor device as claimed in claim 6, further comprising an additional second isolation structure aligned with and in contact with the second isolation structure.

8. The semiconductor device as claimed in claim 7, further comprising a plurality of second device regions disposed on a plurality of second doped region and surrounded by the additional second isolation structure, wherein the plurality of second device regions and the plurality of first device regions have different conductivity types.

9. The semiconductor device as claimed in claim 7, further comprising a plurality of terminals respectively disposed in the additional second isolation structure and the second isolation structure.

10. The semiconductor device as claimed in claim 1, further comprising an insulating layer disposed between the substrate and the semiconductor layer, and bottoms of the first isolation structure and the second isolation structure are in contact with the insulating layer.

\* \* \* \* \*